(12) United States Patent
Dixit

(10) Patent No.: US 8,445,384 B2
(45) Date of Patent: May 21, 2013

(54) HIGH DENSITY SIX TRANSISTOR FINFET SRAM CELL LAYOUT

(75) Inventor: Abhisek Dixit, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 7 days.

(21) Appl. No.: 13/048,224

(22) Filed: Mar. 15, 2011

(65) Prior Publication Data

US 2012/0235240 A1    Sep. 20, 2012

(51) Int. Cl.
*H01L 21/302* (2006.01)
*H01L 21/425* (2006.01)

(52) U.S. Cl.
USPC ........... 438/689; 438/531; 438/302; 438/194; 257/E21.345; 257/E21.014

(58) Field of Classification Search
USPC ............... 438/176, 689, 585, 194, 268, 302, 438/531; 257/E21.345, E21.44, E21.014
See application file for complete search history.

(56) References Cited

U.S. PATENT DOCUMENTS

| | | | |
|---|---|---|---|
| 2003/0006410 A1* | 1/2003 | Doyle | 257/20 |
| 2005/0272195 A1* | 12/2005 | Bryant et al. | 438/212 |
| 2009/0108374 A1 | 4/2009 | Wong et al. | |
| 2010/0308414 A1 | 12/2010 | Dixit | |
| 2011/0018064 A1* | 1/2011 | Doornbos | 257/365 |

OTHER PUBLICATIONS

Witters et al; "Integration of Tall Triple-Gate Devices with Inserted-TaxNy Gate in a 0.274μm2 6T-SRAM Cell and Advanced CMOS Logic Circuits"; Syposium on VLSI Technology Digest of Technical Papers, 2005, pp. 106-107.

* cited by examiner

*Primary Examiner* — Colleen Matthews
*Assistant Examiner* — Galina Yushina
(74) *Attorney, Agent, or Firm* — Whitham, Curtis, Christofferson & Cook, P.C.; Joseph P. Abate

(57) ABSTRACT

Dual orientation of finFET transistors in a static random access memory (SRAM) cell allows aggressive scaling to a minimum feature size of 15 nm and smaller using currently known masking techniques that provide good manufacturing yield. A preferred layout and embodiment features inverters formed from adjacent, parallel finFETs with a shared gate and different conductivity types developed through a double sidewall image transfer process while the preferred dimensions of the inverter finFETs and the pass transistors allow critical dimensions of all transistors to be sufficiently uniform despite the dual transistor orientation of the SRAM cell layout.

9 Claims, 8 Drawing Sheets

Direct litho and etch of SiGe

⟶ First spacer formation

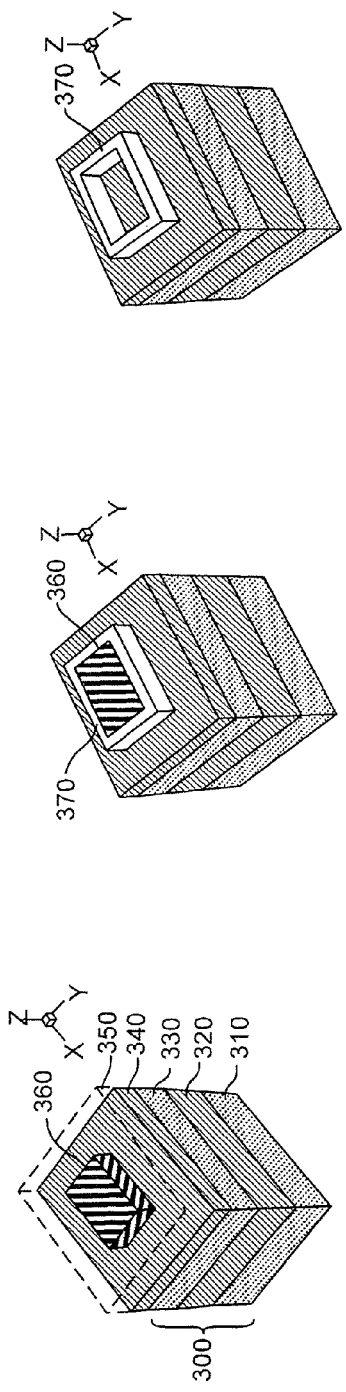
Figure 3A — Direct litho and etch of SiGe
Figure 3B — First spacer formation
Figure 3C — SiGe lift-off/etch
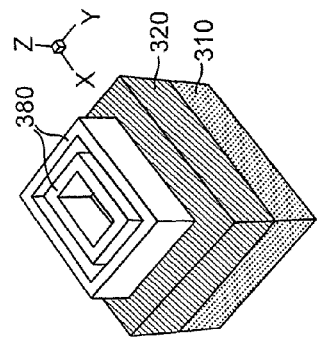
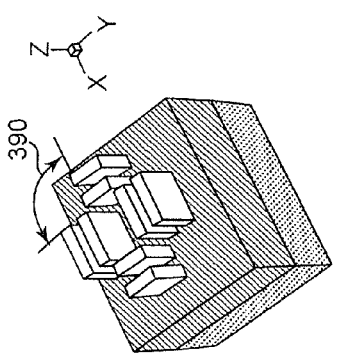
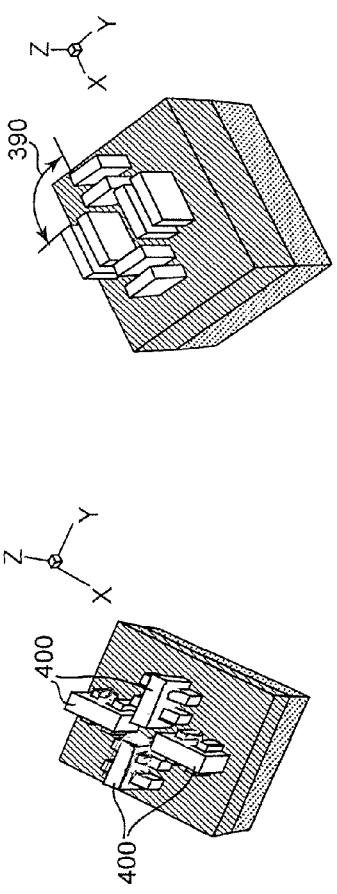
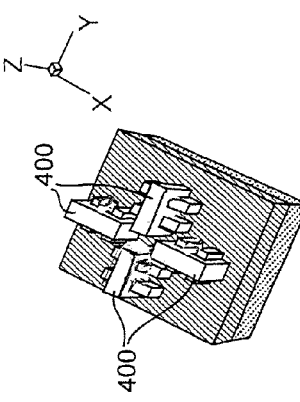
Figure 3D — Second spacer formation followed by Oxide and Si anisotropic etch (quadrupling STI process)
Figure 3E — Fin-edge termination using a dark-field mask
Figure 3F — After Hk-MG-Poly gate module

HIGH DENSITY SIX TRANSISTOR FINFET SRAM CELL LAYOUT

FIELD OF THE INVENTION

The present invention generally relates to integrated circuit logic structures and, more particularly, to static random access memory (SRAM) memory cells formed using FinFET transistors, requiring reduced chip area, and which can be fabricated at a minimum feature size of 15 nm or smaller using currently existing mask and impurity implantation technology.

BACKGROUND OF THE INVENTION

Digital memory devices are essential elements of any digital data processor. Modern digital data processors generally use at least several different types of memory devices which have been developed to answer different performance requirements within various functional portions of the data processing system. For example, so-called hard drives are typically used for efficient long term storage of large amounts of data and programs but allow relatively rapid access thereto, usually in large blocks, even though such access generally requires a substantial number of clock cycles of the processor. Dynamic memories where data is stored as charge in a capacitor generally allow much faster access comparable to a smaller number of processor clock cycles and for smaller amounts of data which may be selectively addressed. However, dynamic memories must be periodically refreshed to compensate for charge that may leak from the capacitors. Such refresh operations may impose a longer (e.g. worst-case) access time. Nevertheless, dynamic random access memories are widely used since the simplicity of dynamic memory cells (e.g. only a single transistor and capacitor per memory cell in the array area) allows many millions of memory cells to be formed economically and reliably on a chip of moderate size, Where selectively accessed data must be returned from storage in a substantially uniform and very small number of processor clock cycles, such as for cache memory, static memory structures are widely used and are referred to as static random access memories (SRAMs). SRAMs comprise many rows and columns of storage cells, each comprising a bistable circuit comprising at least two transistors and additional selection/pass transistors allowing addressing of individual memory cells. Bistable circuits do not require refreshing and can be switched from one bistable state to another at a speed limited only by the resistance and capacitance of the control electrodes of the transistors and their connections which determines the slew rate of the output voltage. Thus, in addition to the desirability of forming larger numbers of memory cells on a chip of reasonable size, there is substantial incentive toward reduction of memory cell size and increase of integration density to minimize resistance and capacitance of transistors and their connections in order to improve performance. Additionally, since SRAM response speed is critical, SRAMs are usually included in the integrated circuits which access them and can often occupy 50% or more of the chip area which, in turn, tends to limit the amount of other logic that can be provided unless bit-cell area/footprint is minimized.

Recently, SRAM cell designs have been developed using FinFETs in which the conduction channel is formed as a raised, fin-like structure, allowing the gate to be placed on two or more sides of the channel to improve conduction and leakage control even though there is, at the present state of the art, a small penalty in memory cell area for a given minimum lithographic feature size and bit-cell layout since more aggressive scaling is relatively more well-developed in regard to planar FET designs. In fact, FinFETs are considered to be relatively more scalable than planar FETs but have been used primarily for low standby and operating power applications where aggressive scaling is unnecessary or less critical.

SUMMARY OF THE INVENTION

It is therefore an object of the present invention to provide an SRAM cell layout which can be scaled to a 15 nm or smaller minimum feature size to improve economy and performance but using conventional masks that do not limit reduction of bit-cell size or footprint and including FinFETs of improved robustness.

In order to accomplish these and other objects of the invention, an integrated circuit logic element or component including FinFETS is provided comprising two pairs of parallel fins which are oriented in orthogonal directions to each other wherein each fin of the two pairs of parallel fins has impurities implanted therein of the same or different conductivity types such that the two pairs of parallel fins can function as two, three or four transistors, a gate structure common to each pair of fins, and connections between the two, three or four transistors.

In accordance with another aspect of the invention, an SRAM bit-cell layout is provided comprising two pairs of complementary FinFETs proximate to opposing sides of an area of the bit cell, each the pair of complementary transistors comprising two parallel fins and having a common gate and a common node to function as an inverter, two pass FinFET transistors, each of the two pass FinFET transistors being proximate to one of two other opposing sides of the area of the bit cell and formed of two parallel fins oriented orthogonally to the parallel fins of the two pairs of complementary FinFETs, and connections between the two pairs of complementary FinFETs.

In accordance with a further aspect of the invention, methods of forming an integrated circuit are provided comprising steps of patterning a sacrificial layer on a substrate to form a structure having a prism shape, forming sidewalls on a periphery of the structure having a prism shape, removing the structure having a prism shape selectively to the sidewalls, forming further sidewalls on inner and outer sides of the sidewalls, removing the sidewalls selectively to the further sidewalls to form two concentric patterns, and transferring the two concentric patterns to the substrate to form a pair of concentric structures and/or steps of forming at least two pairs of semiconductor fins on a substrate, implanting impurities of a first conductivity type preferentially in a first fin of a pair of the fins, and implanting impurities of a second conductivity type preferentially in a second fin of the pair of fins.

In summary, the invention comprehends an integrated circuit structure that may be manufactured simply at an arbitrarily small minimum feature size using currently available mask and implantation technology and that is usable as a logic element that may contain 2, 3 or 4 FinFET transistors comprising four conduction channel fins arranged in two pairs of fins, depending upon the impurity implantations made in each pair of fins, and which is particularly applicable to a six transistor SRAM bit-cell layout which is more compact than current designs and highly scalable while providing improved fidelity of fin formation. In such an application, it allows a more compact layout with more conveniently and reliably formed connections that can be scaled to an arbitrarily small footprint area at correspondingly increased integration density. The invention further comprehends the more compact SRAM bit-cell layout and the techniques of forming two pairs of differently oriented FinFET transistors and impurity implantations to form 2, 3 or 4 transistors from two pairs of fins or, preferably, six transistors from four pairs of fins such as for an SRAM bit-cell, and so on.

BRIEF DESCRIPTION OF THE DRAWINGS

The foregoing and other objects, aspects and advantages will be better understood from the following detailed description of a preferred embodiment of the invention with reference to the drawings, in which:

FIGS. 3A, 3B, 3C, 3D, 3E and 3F illustrate the process flow to fabricate the dual orientation FinFETs in accordance with the invention.

DETAILED DESCRIPTION OF A PREFERRED EMBODIMENT OF THE INVENTION

Figure 1A:
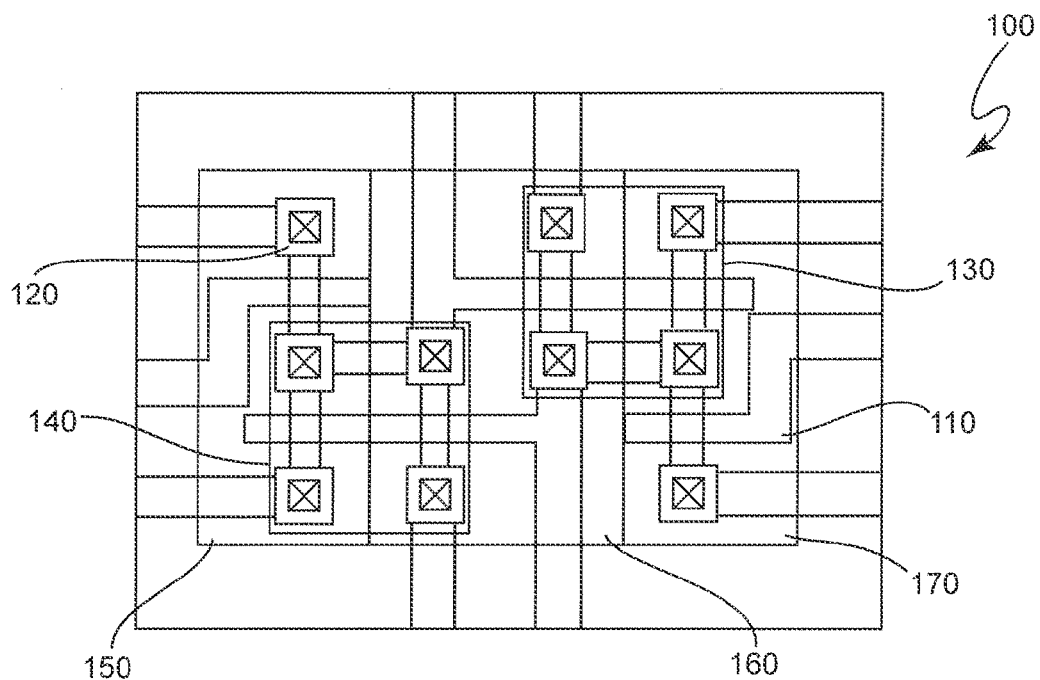
FIG. 1A is a plan view of a known, six transistor SRAM memory bit-cell layout using FinFET transistors, FIG. 1AA is a schematic diagram of the plan view of the bit-cell layout of FIG. 1A.
Figure 1B:
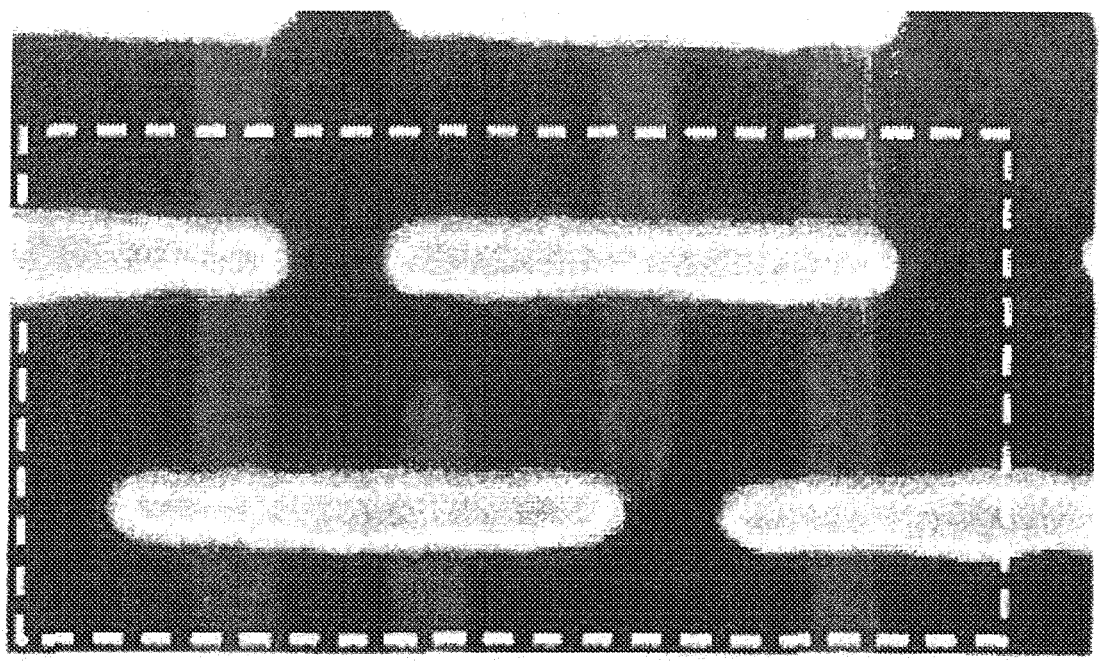
FIG. 1B is a top down scanning electron microscope (SEM) image of the memory cell of FIG. 1A.
Figure 1A:
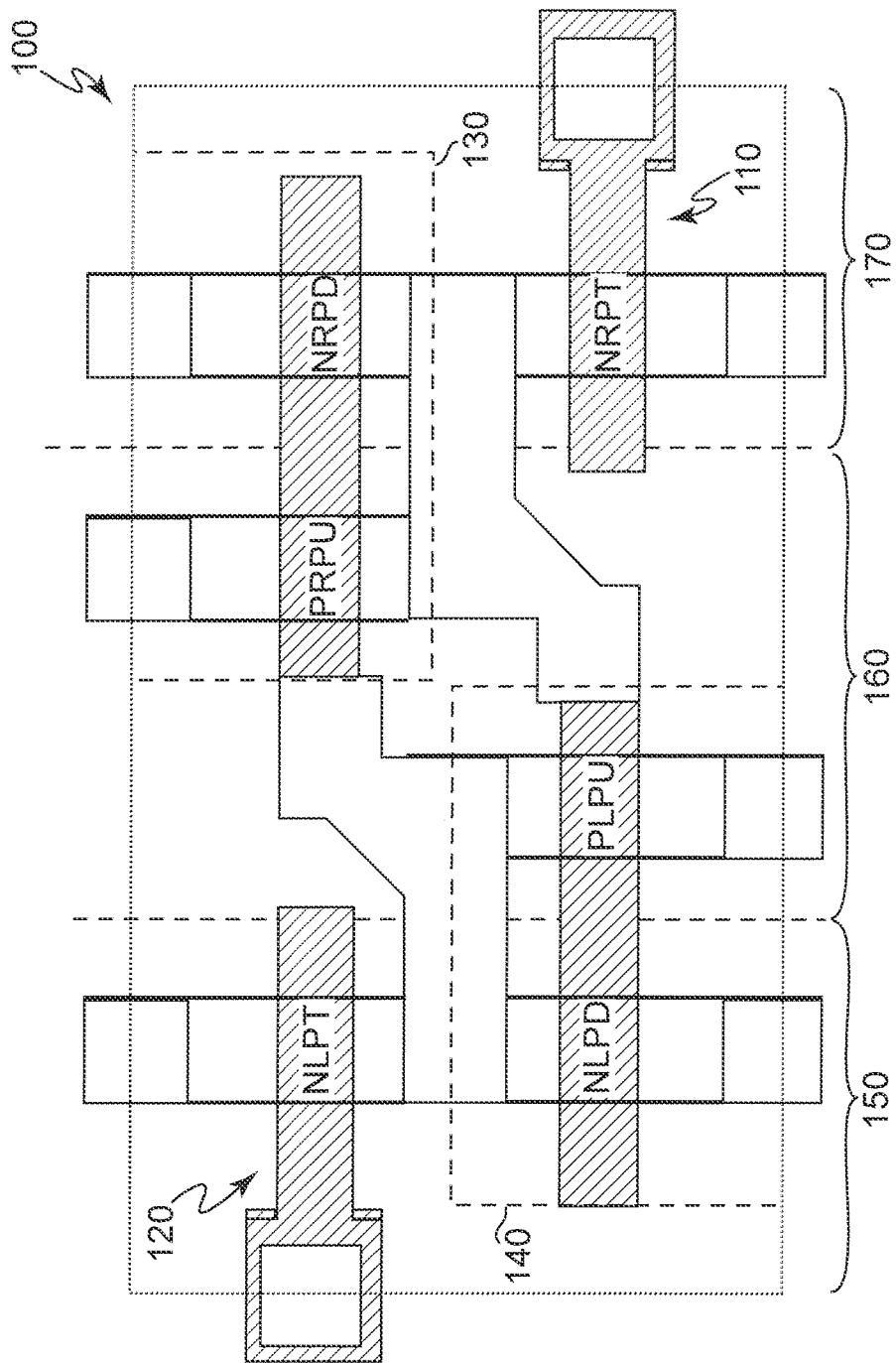

Referring now to the drawings, and more particularly to FIG. 1A, there is shown a plan view of the layout of a known SRAM cell including six transistors and sufficient to store a single bit (thus, sometimes referred to hereinafter as a bit-cell). FIG. 1AA is an enlarged schematic depiction of the plan view of the bit-cell layout of FIG. 1A. The transistors are indicated with the same reference numerals in both FIGS. 1A and 1AA. FIG. 1B is a scanning electron microscope (SEM) image of a device having the same layout but prior to the application of connections shown in FIG. 1A. The brighter, horizontal areas appearing in FIG. 1B are polysilicon gates while the darker, vertical areas of FIG. 1B are the FinFET fins.

As a compromise between performance and complexity, an SRAM memory cell usually comprises six transistors although as few as four transistors or eight or more transistors can be used in each SRAM cell. Using only four transistors requires inclusion of resistors which degrades performance. Using eight or more transistors may also tend to compromise performance by compromising the minimum cell size/footprint that can be achieved as well as compromising the density of integration of SRAM cells on a chip and increasing manufacturing costs and potentially compromising manufacturing yield.

It should be understood that while the invention is not depicted in FIG. 1A, 1AA or 1B, no portion of any of these Figures is admitted to be prior art in regard to the present invention and are thus labeled "Related Art". Rather, FIGS. 1A and 1AA should be regarded and understood as being the most compact layout for an SRAM cell developed prior to the present invention. The area corresponding to a single SRAM cell is depicted by a dashed line in FIG. 1B.

The compact layout shown in FIG. 1A includes six transistors: two pass gate transistors 110, 120 and two pairs 130, 140 of complementary transistors connected to form inverters. The inputs and outputs of the respective inverters are cross-coupled to form a bistable circuit. The layout is divided into three vertical sections indicated by lines and brackets 150, 160 and 170 and the transistors are located in each section such that transistors in any section will include only a single conductivity type of transistor. Typically, sections 150 and 170 will contain only NFETs and section 160 will contain only PFETs. Such an arrangement of transistors by conductivity type simplifies and reduces criticality of masking for impurity implantation as will be discussed in greater detail below in connection with FIGS. 5A and 5C. It should also be noted that all transistors in the layout of FIGS. 1A and 1AA provide conduction current in a common direction (vertically, as illustrated in FIG. 1A).

The smallest embodiment of an SRAM cell having the configuration shown in FIGS. 1A and 1AA has been fabricated using a 22 nm minimum lithographic feature size and requires an area of 0.1 $\mu m^2$ for (planar) bulk CMOS transistors and 0.128 $\mu m^2$ for FinFET transistors. At 0.128 $\mu m^2$ with direct, resist-based patterning, lithography processes are the principal limiting factor in scaling the bit-cell to smaller areas and unacceptable losses in manufacturing yield prevent smaller minimum feature sizes from being used.

Figure 1C:
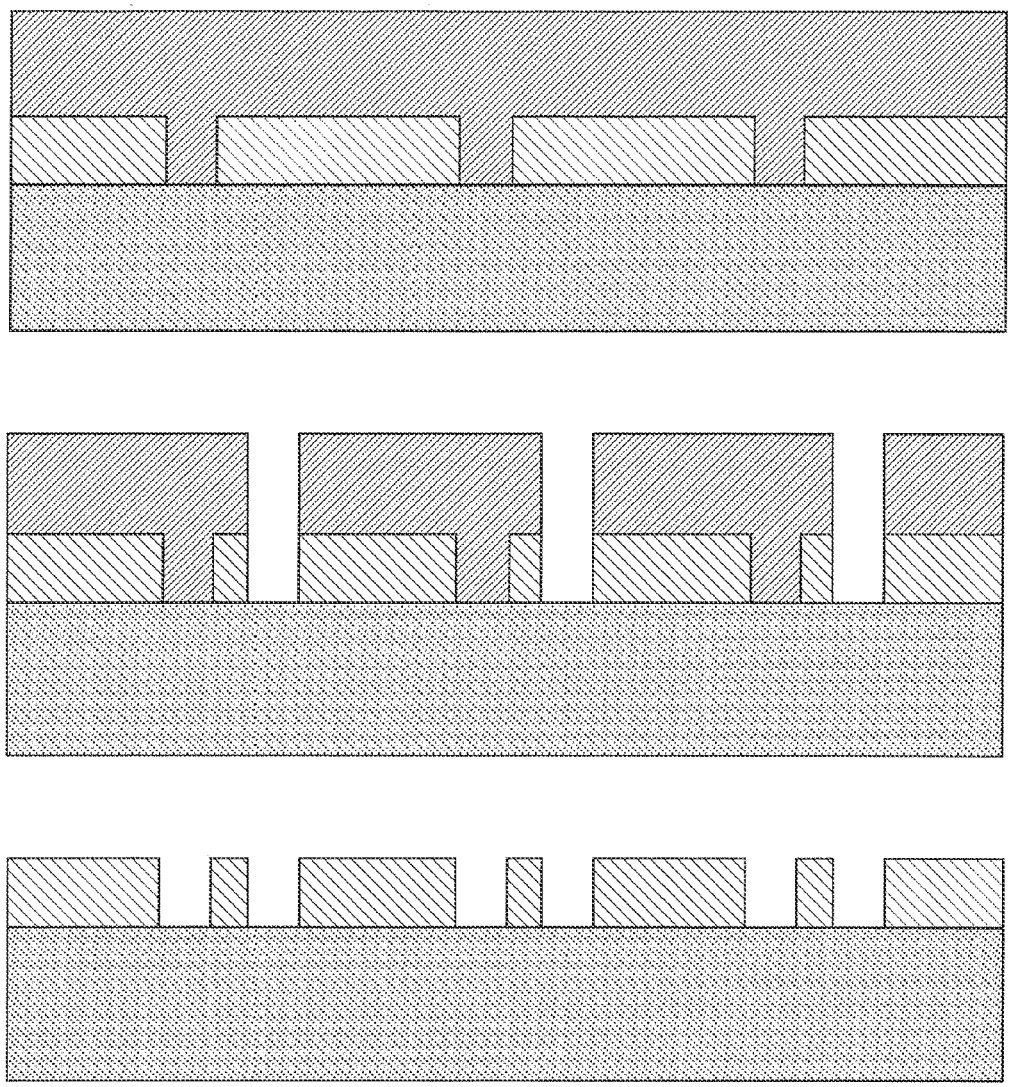
FIG. 1C depicts a double patterning process required for making connections to active areas in the layout of FIG. 1A and in the invention.

The contact to active (CA) level lithography and etch processes are particularly challenging as landing pads are overly shrunk and leave small tolerance for overlay errors when scaling is attempted. Most of the current SRAM processes use double patterning, sometimes referred to as split pitch techniques, to meet the CA level resolution and pitch requirements, for which overlay accuracy is particularly critical, as depicted in FIG. 1C, showing in cross-section from top to bottom the application of a resist over a layer which has already been patterned, patterning the resist and etching additional features in the layer and removal of the resist to result in patterning of the layer at a higher feature pitch than the feature pitch of the masks used for resist exposure. (Ideally, the spacing of features formed in this manner would usually be substantially uniform. While different resulting spacing is shown the difference is less than what would be deemed overlay error but it can be appreciated from FIG. 1C how overlay error could occur.) Therefore, further reduction of SRAM cell area cannot be projected from the best technology available prior to the present invention.

Figure 2:
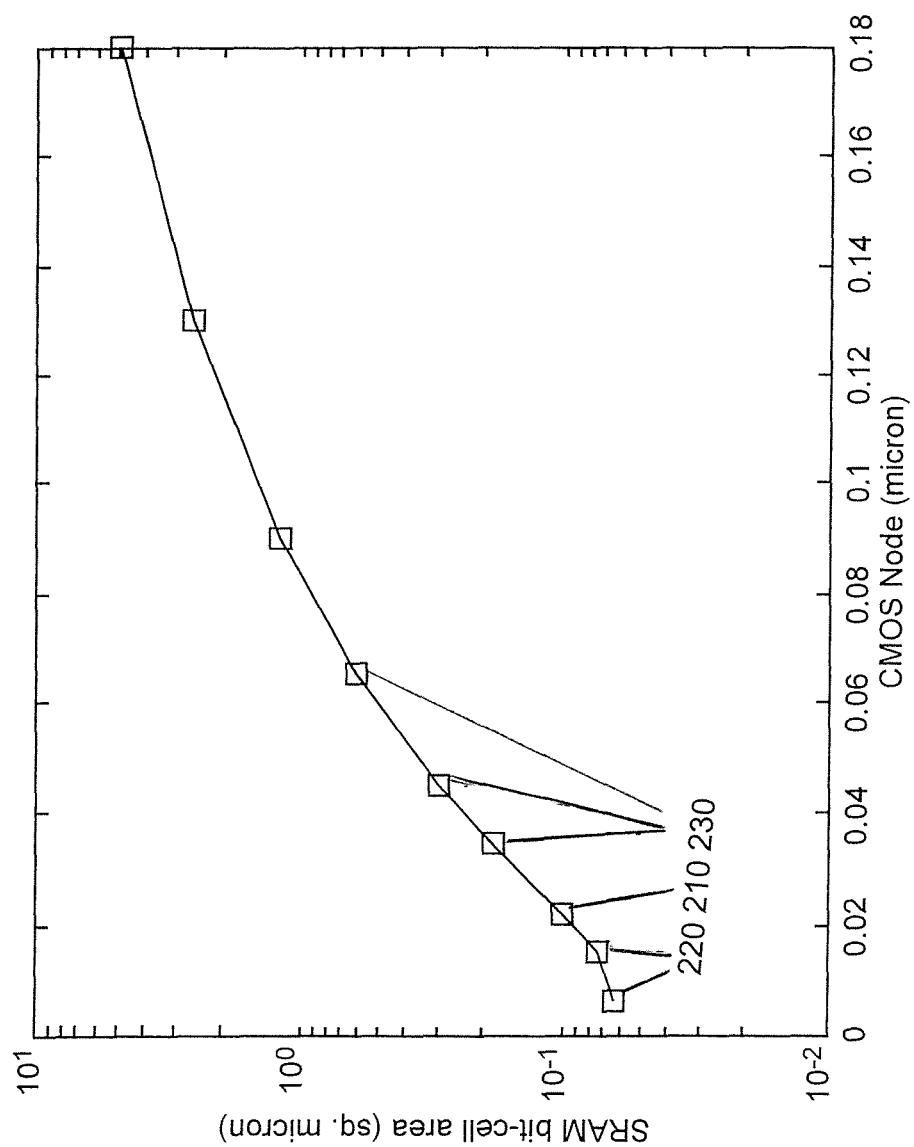
FIG. 2 is a graph of minimum lithographic feature size and the resulting memory cell area or footprint.

More specifically, with reference to FIG. 2, which is not admitted to be prior art in regard to the present invention and is labeled "Related Art" for the reasons indicated above in regard to FIGS. 1A and 1B as well as being an analysis incident to the making of the present invention, the SRAM bit-cell area for the layout of FIG. 1A is plotted as a function of the minimum lithographic feature size (or half-pitch/minimum spacing between lines at the first metal or M1 level, sometimes referred to as a CMOS node (e.g. "15 nm node" which may infer additional design ground rules pertaining to the minimum feature size and which may also be equal to the gate length in some particular technologies) specified in the ground rules for a particular SRAM embodiment using that layout. Thus, FIG. 2 is a scaling curve that projects a SRAM cell area (using the layout of FIG. 1A) for any particular minimum lithographic feature size whether or not fabrication is practical. The data point 210 corresponds to the smallest FinFET cell fabricated to date as discussed above. Points 220 are extrapolated from other data points 230 representing embodiments at larger minimum lithographic feature sizes based on a quadratic fit to actual data points 210 and 230.

It can be readily observed from the scaling curve of FIG. 2 that the reduction of SRAM cell area with reduction of minimum lithographic feature size becomes significantly less below a minimum lithographic feature size of 22 nm. That is, compared to approximately 0.1 $\mu m^2$ for a 22 nm minimum lithographic feature size (which implies planar CMOS rather than the preferred FinFETs having better conduction and leakage control), the optimum SRAM bit-cell area is only slightly reduced to 0.074 $\mu m^2$ for a 15 nm minimum lithographic feature size which, in any case, cannot be supported by current lithographic technology and the most compact SRAM bit-cell layout that has been developed prior to the present invention.

Figure 4:
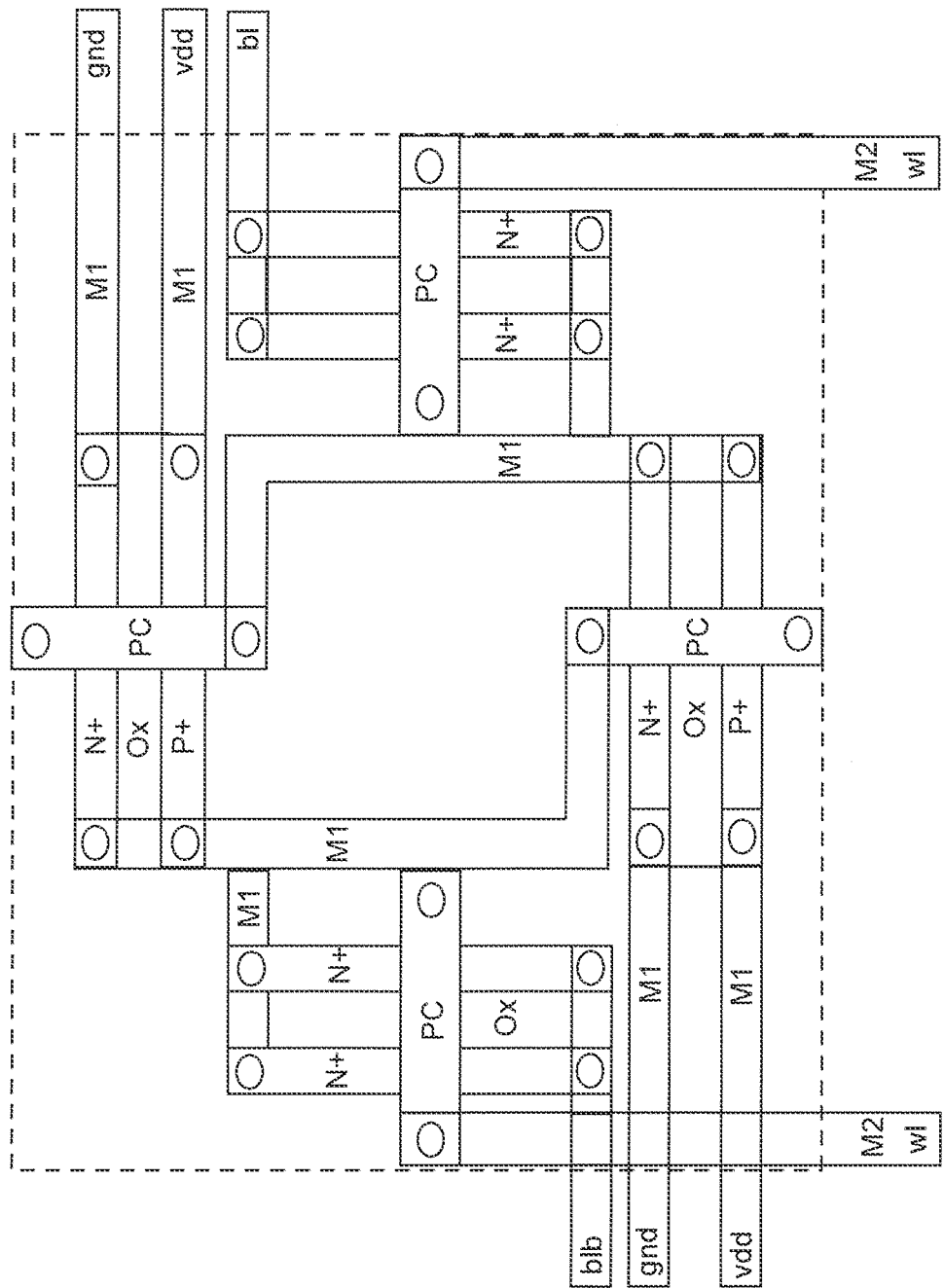
FIG. 4 is a plan view of the layout of an SRAM cell in accordance with the invention, FIGS. 5A, 5B, 5C and 5D provide a comparison of lithographic mask usage between the conventional SRAM cell layout of FIG. 1A and the layout of FIG. 4 in accordance with the invention.

Referring briefly now to FIG. 4, a plan view of the SRAM bit-cell layout in accordance with the present invention is shown. This layout also includes six transistors: two pairs of complementary narrow FinFET transistors at the top and bottom of the bit-cell, respectively, and two relatively wider (e.g. comprising two fins) similar conductivity FinFET pass-gate (NFET) transistors at the right and left of the bit cell in the orientation shown. The boundaries of the bit-cell are indicated by a dashed line which, as drawn, allow a sufficient border margin for isolation (or isolation structures such as shallow trench isolation (STI) structures) between the transistors at the periphery of respective cells.

From even a cursory comparison of the bit-cell layout of FIG. 4 with the bit-cell layout of FIG. 1A, it will be appreciated that the transistors in the layout of FIG. 4, in accordance with the invention, are oriented in two different orthogonal (but not necessarily perpendicular) directions although perpendicular orientations is preferred for simplification of implant processing and some other manufacturing processes, as will be assumed for simplicity in discussion of the fabrication of the memory cell below. As alluded to above, orientation of transistors in more than a single direction is not advisable in advanced CMOS technologies due to difficulty in controlling uniformity and meeting specifications for critical dimensions in more than a single direction. However, the inventors have discovered that in the case of FinFET SRAMs, to maintain the required cell design ratio (typically a function of the ratio of width of the pass transistor to the width of the pull-down transistor) the pass transistors can have a gate length different from the transistors in the inverters and be of a substantially greater effective width (e.g. developed through use of two FinFET channels in parallel) than the complementary transistors in the respective inverter transistor pairs. Further, while having transistors oriented in more than one direction has presented a problem in prior aggressively scaled integrated circuits, since two of the pairs of fins form parallel pass transistors, their conduction characteristics are relatively less critical; allowing different transistor orientations to be employed. Therefore, the SRAM bit-cell layout of FIG. 4 provides a substantially ideal circumstance for applying a highly counter-intuitive transistor orientation to provide not only a much more compact layout that can utilize 15 nm and smaller minimum lithographic feature sizes to greater advantage (e.g. continuing a substantially monotonic reduction in cell areas with reduction in minimum lithographic feature size contrary to the diminishing reduction in bit-cell area discussed above in connection with FIG. 2) as well as providing improved fidelity of fin formation and substantial convenience in several other manufacturing processes as will be discussed below.

Referring now to FIG. 3A-3F, the formation of FinFET transistors having an orientation as shown in FIG. 4 will now be discussed. It should be understood that only so-called front-end-of-line (FEOL) processes for transistor formation are illustrated in FIG. 3A-3F while implantation masking (also FEOL processes) is illustrated in FIG. 5A-5D, as will be discussed below. Wiring is performed in a manner well-understood in the art but is also somewhat simplified while some criticality is reduced in accordance with the invention.

It is to be understood that, for clarity, FIGS. 3A-3F illustrate only the portion of the substrate corresponding to the perimeter of a single bit-cell area as indicated by the dashed line in FIG. 4 but that, in practice, all of the SRAM cells of a potentially large array would be formed concurrently. This processing can be readily accomplished at high manufacturing yield since only two relatively coarse lithographic masks are required for the formation of the fins and only two relatively coarse masks are required for implantation. By the same token, the required lithographic mask defines material to be removed and the structures resulting from the illustrated processing (similar to self-aligned processing) are thus fully decoupled from the limitations on the minimum size of features that can be lithographically resolved. Therefore, by use of a double sidewall image transfer (SIT) technique in accordance with the invention, the SRAM bit-cell of the invention can be fabricated at 15 nm and smaller minimum lithographic feature sizes as such resolution becomes available and practical.

FIG. 3A illustrates a semiconductor-on-insulator substrate 300 comprising a handling substrate 310, a buried insulator layer, usually of oxide (thus often referred to as a buried oxide or BOX layer regardless of the insulating material used) 320, and an active semiconductor (e.g. silicon, germanium, SiGe or the like) layer 330. However, it is to be understood that the invention can be applied to any type of substrate and the constitution and structure of the substrate 300 is, in practice, generally dictated by the design of other circuits and devices to be formed on the same chip with the SRAM array and thus is otherwise irrelevant to the successful practice of the invention. Therefore, substrate 300 could be, for example, simply a bulk silicon substrate or any other construction or material. That is, a further insulator layer 340 is applied to the surface of substrate 300 and a sacrificial layer 350 is formed thereover and patterned, using a resist, to form a raised prism-shaped (e.g. rectangular for forming four pairs of fins, the term "prism" being used in the geometrical sense rather than the optical sense) structure 360. The material of the insulator layer 340 is not critical to the practice of the invention other than that the material of the sacrificial layer 350 for defining fins of the FinFETs should be etchable selectively to it. Similarly, the material of the sacrificial layer 350 is not critical other than that it should be etchable selectively to the material of the sidewalls which will be formed thereon. SiGe is a suitable and preferred material for the sacrificial layer 350.

Then, as shown in FIG. 3B a sidewall spacer 370 is formed on the perimeter of the raised prism-shaped structure 360. This is generally achieved by applying a conformal blanket layer of material by isotropic deposition followed by an anisotropic etch. The raised rectangular portion 360 (the remainder of the sacrificial layer 350) is then removed by a selective etch, resulting in the raised rectangular structure shown in FIG. 3C. The remaining spacer thus formed is in the shape of the sides of the raised rectangular structure 360 and the process is thus referred to as sidewall image transfer (SIT).

The SIT process (e.g. isotropic deposition followed by an anisotropic etch or, possibly, selective deposition with or without planarization, generally followed by the removal of the structure on which the sidewall is formed) is then repeated to form sidewalls (preferably of oxide) on the outside and inside of spacer 370. Spacer 370 can then be removed by selective etching to yield two concentric rectangular structures with parallel sides as shown in FIG. 3D. These concentric rectangular structures can then be used as a mask for an anisotropic etch to transfer the two concentric rectangular patterns to layer 340 and, in turn, to active semiconductor layer 330 of substrate 300 for which the BOX layer 320 forms an inherent etch stop during a selective etch to form similarly shaped concentric rectangular structures 380 from the active semiconductor portion of the substrate, after which the structure 370 can be removed by a further selective etch. In the case of using a bulk semiconductor (e.g. silicon) substrate, depending on the height requirement for a fin, a timed etch is used, generally to obtain taller concentric rectangular structures and, ultimately, taller fins using a longer timed etch such that the conduction channel of the FinFET is principally if not entirely within the fin. Thus such FinFETS need not be formed on an insulator as is well-understood in the art. Fin edge termination is then performed using any type of mask and etching to remove the angled corner portions 390 of the concentric rectangular structures 380 leaving only four pairs of parallel linear fins with two pairs of parallel fins being oriented orthogonally to the other two pairs of parallel fins as illustrated in FIG. 3E.

Once the fin edge termination process is performed, a gate dielectric, preferably of High-K material is applied to the fins and polysilicon and/or mid-gap (MG) metal is deposited to form gates of the FinFETs as illustrated in FIG. 3F by any suitable known process such as that disclosed in Published U. S. Patent Application 2010/0308414A1 (which is hereby fully incorporated by reference) to provide four gate electrodes 400; one for each pair of fins as also shown in FIG. 4. The implantation processes can then be performed subsequent to gate formation and using the gate structures as an implantation mask since, for FinFETs, impurity implantation is performed only in the source and drain regions of the transistors. Only unintentional base doping of the channels which is often p-type and in the range of $5 \times 10^{13}$ to $5 \times 10^{14}$ per $cm^3$ is likely to occur and may be regarded as substantially negligible. It will be appreciated that each pair of fins can operate as either a single transistor or a pair of transistors which are commonly controlled, depending on the connections made and conductivity type of the respective S/D regions of the fins of a pair; as established by impurity implantation processes which will now be discussed.

Figure 5A:
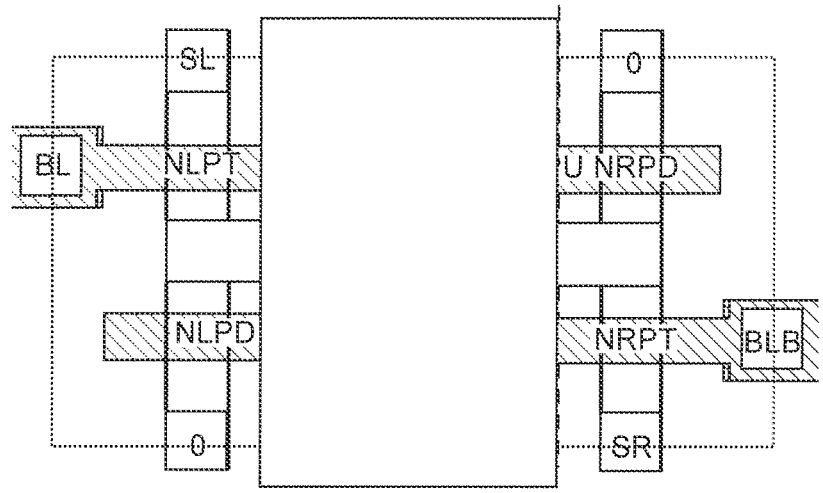
FIG. 5E depicts the angled fin implantation scheme in accordance with the invention.
Figure 5B:
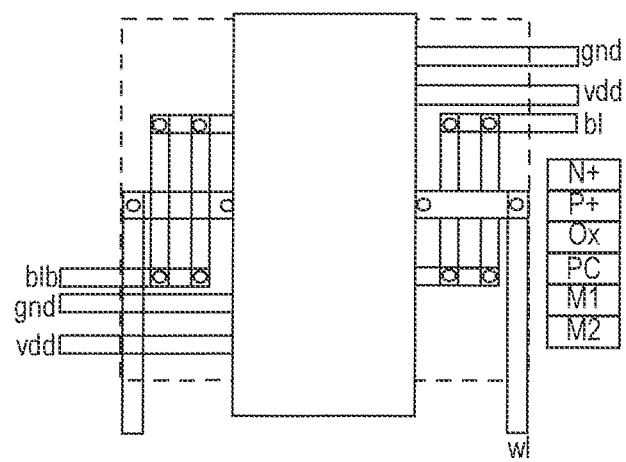
Figure 5C:
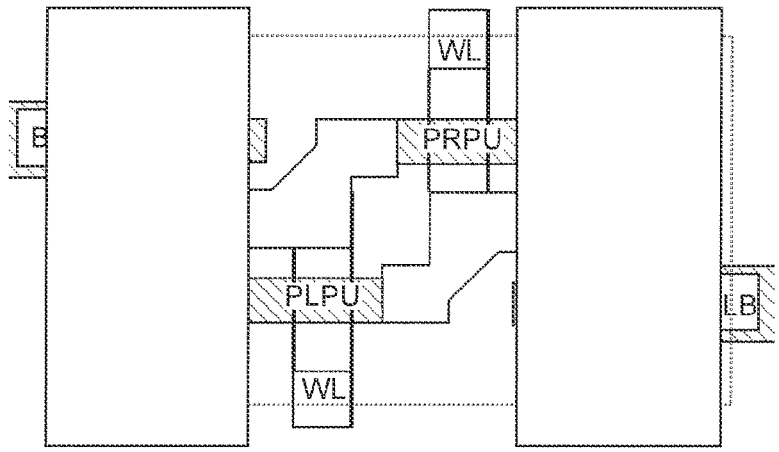
Figure 5D:
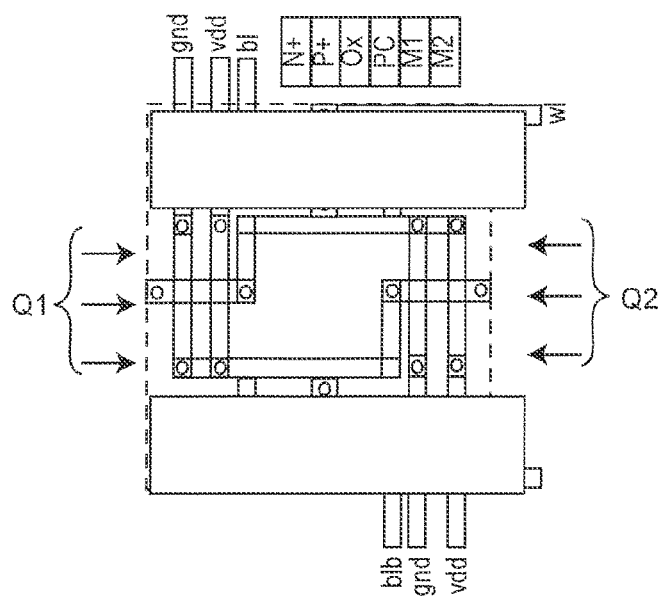
Figure 5E:
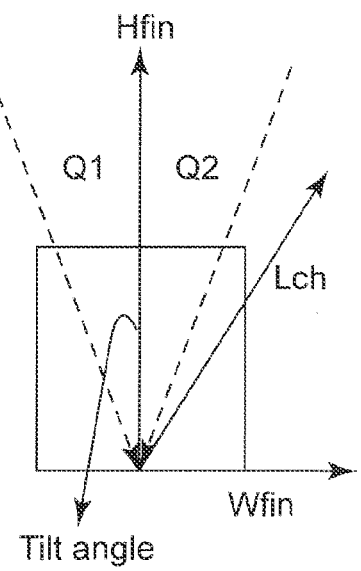

Referring now to FIGS. 5A-5E, the implantation processes to form, for example, the six FinFETS of an SRAM bit-cell in accordance with the invention as shown in FIGS. 5B and 5D are compared with the conventional implantation processes for conventional but aggressively scaled SRAM bit-cell layouts such as that of FIG. 1A, as shown in FIGS. 5A and 5C. Therefore, FIGS. 5A and 5C are not admitted to be prior art in regard to the present invention and are thus labeled "Related Art" for the reasons discussed above in regard to FIGS. 1A, 1B and 2.

As alluded to above, the transistors in the SRAM bit-cell layout of FIGS. 1A and 1AA are arranged by conductivity type in three separate sections 150, 160 and 170 of the layout. As shown in FIG. 5A, section 160 is masked such that impurities (in this case, arsenic, to form NFETs) may be selectively implanted in sections 150 and 170 where the pass gate transistors NLPT (n-type, left side pass transistor) and NRPT (-type, right side, pass transistor) and one transistor of each inverter pair, NLPD (n-type, left side, pull-down) and NRPD (-type, right side, pull down) are located. In a complementary fashion, as shown in FIG. 5C, sections 150 and 170 are masked and impurities (in this case, boron to form p-type transistors) are implanted in section 160 where the complementary transistors of the inverter pairs, PLPU (p-type, left side, pull-up) and PRPU (p-type right side, pull-up) are located.

In contrast, as shown in FIG. 5B, a mask similar to that of FIG. 5A may be used but, in accordance with the FinFET layout of FIG. 4, only the pairs of fins corresponding to the pass transistors are exposed for implantation (in this case, with arsenic to form NFETs) to be performed. However, in sharp contrast with FIG. 5C, FIG. 5D shows masking complementary to that of FIG. 5B but with relative rotation of the bit-cell area by the same angle as the difference in direction of orientation of the fins when formed as discussed above in connection with FIGS. 3A-3F (e.g. 90°); exposing the fins of FinFETS of the of the inverter pairs. Impurity implantations of different conductivity types can then be made at respective opposing angles Q1 and Q2 as shown by dashed lines in FIG. 5E; implantation Q1 (in this case, preferably arsenic for n-type fins) being from the relative left as shown and Q2 (in this case, preferably boron for p-type fins) being from the relative right as shown. In practice, the implantations would preferably be performed from the same direction with the fin (e.g. on the wafer) tilted by, for example, 20° and rotated by, for example, 90° clockwise or counter-clockwise from the reference position of FIG. 5B for the respective Q1 and Q2 impurity implant operations as shown in greater detail in FIG. 5E. It is preferable that the impurity implantations be predominately located in the source and drain regions of the FinFETs; using the gate structure to mask the channel regions during the implantation processes.

Thus, one fin of each pair of fins preferentially receives the Q1 implantation and the other fin of each pair preferentially receives the Q2 implantation and separate transistors of opposite conductivity types are created which can then be commonly controlled to operate as inverters since each pair of complementary transistors shares a common gate structure that is nevertheless separate from the gate structure of the other pair of complementary transistors. (As a matter of terminology, the implantation angle is referred to as the tilt angle in FIG. 5E. Further, it is common to specify the tilt angle as a division of the wafer into quadrants, Q1-Q4, as a matter of the operation of beam implantation systems. A combination of the tilt angle and the rotation of the wafer (e.g. from the notch of the wafer) determines the implantation processes which will be preferential to particular structures. It should be appreciated that this technique of forming a complementary pair of transistor using angled implants could, in theory, also be applied to the respective fins exposed by the mask of FIG. 5B for an appropriate logic application even though such an implantation is inappropriate to forming a high conductivity pass transistor for an SRAM. This combination of FinFETS formed from orthogonally oriented pairs of fins wherein each fin of either or both pairs may be made to function as either a single transistor or a pair of complementary transistors, while particularly advantageous in implementation of an SRAM bit-cell, may also be useful for other aggressively scaled logic applications or elements. For example, an array of selectively addressable inverters might be employed in encryption logic or a pseudo-random number generator using a shift register and selective feedback or a serially connected pair of inverters could be used as an amplifier/repeater or level shifter.

It should be particularly appreciated from the comparison of implantation masking provided by FIGS. 5A-5D that, while the implantation processes in accordance with the invention are radically different from those employed in connection with, for example, the SRAM bit-cell layout of FIG. 1A, no additional complexity of mask design or resolution is required by the invention and the masks are of a feature size much larger than the minimum lithographic feature size of the circuit elements being produced and scale proportionally with the minimum feature size and fin length. Further, the implantation processes, themselves, in accordance with the invention, involve only processes (albeit in a particular combination) which are individually well-understood and which can be accomplished with high manufacturing yield. It should be noted in this regard that fin fidelity is improved in the FinFETs configured in accordance with the invention since the tall and narrow fins are reinforced by the gate insulator and gate electrode which partially or completely fills the gap between the fins of each pair of FinFETs. This structure is thus far more stable and mechanically robust than conventional single FinFET in which a single fin extends from the substrate or buried oxide only from its narrow base which tends to compromise or limit manufacturing yield. Therefore the invention can be reliably scaled to any arbitrarily small feature size using currently available or foreseeable lithographic techniques and, conversely, the availability of increased lithographic resolution or lack thereof does not limit scaling of the invention, and SRAM bit cells in particular, to arbitrarily small areas or footprints.

The gate structure of each inverter pair, formed as discussed above in connection with FIG. 3F, can then be connected to the node connecting the other complementary pair of transistors, thus serving as an inverter output, to form a bistable circuit while both such connections can be formed with conductors principally in a single (e.g. first metal or M1) level since these connections need not physically cross each other as shown in FIG. 4. connections to power and the bit lines can be formed in the same connection level. This leaves only the connections to the word lines to be formed at a different (e.g. second metal or M2) level as also shown in FIG. 4. The two levels at which connections are made may be easily connected to salient, extending portions of the gate structures as shown in FIG. 4. It should be noted from a comparison of FIGS. 1A and 4 that the number of CA level connections has been reduced from ten in the prior bit-cell layout to eight in accordance with the bit-cell layout of the invention.

In view of the foregoing, it is seen that the invention provides a novel logic circuit element or component that can function as two, three or four transistors of arbitrary conductivity types and can be fabricated at arbitrarily small minimum feature size without criticality in regard to mask complexity, feature size or overlay error. The transistors are formed as FinFETs having improved conduction control characteristics and can be formed by simple and high manufacturing yield double SIT and angled implantation process requiring no mask minimum lithographic feature size or complexity beyond that currently available in the art. The invention is particularly applicable to the formation of six transistor SRAM bit-cells that may be scaled to arbitrarily small areas and which can be implemented with a SRAM bit-cell layout substantially more compact than previously possible. While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method of forming an integrated circuit comprising steps of patterning a sacrificial layer on a substrate to form a structure having a prism shape, forming sacrificial sidewalls on a periphery of said structure having a prism shape, removing the structure having a prism shape selectively to the sacrificial sidewalls, forming further sidewalls on inner and outer sides of the sacrificial sidewalls, removing the sacrificial sidewalls selectively to the further sidewalls to form two concentric patterns each having at least a pair of orthogonal sides, and transferring the two concentric patterns to said substrate to form two concentric structures each having at least a pair of orthogonal sides.

2. The method as recited in claim 1, wherein said prism shape is a rectangular prism shape.

3. The method as recited in claim 1, further comprising a step of separating portions of said pair of concentric structures to form at least two pairs of fins such that fins of one pair are orthogonal to fins of another pair.

4. The method as recited in claim 3, comprising the further step of
implanting impurities of a first conductivity type preferentially in first fins of said at least two pairs of fins, and
implanting impurities of a second conductivity type preferentially in second fins of said at least two pairs of fins.

5. The method as recited in claim 3, including the further step of
forming a gate structure across a pair of said fins.

6. The method as recited in claim 5, wherein said gate structure extends between said pair of said fins.

7. The method as recited in claim 3, comprising the further step of
implanting impurities of a first conductivity type preferentially in a first fin of a pair of said fins, and
implanting impurities of a second conductivity type preferentially in a second fin of said pair of fins.

8. The method as recited in claim 7, comprising the further steps of
implanting impurities into both fins of another pair of said fins while masking said pair of fins.

9. A method of forming an integrated circuit comprising steps of forming at least two pairs of semiconductor fins on a substrate, fins of one pair are orthogonal to fins of another pair,
implanting impurities of a first conductivity type preferentially in a first fin of one pair of said fins, and implanting impurities of a second conductivity type preferentially in a second fin of the one pair of fins, and implanting impurities into both fins of another pair of said fins while masking the one pair of fins.

* * * * *